US012782826B2

(12) United States Patent
Reisloehner et al.

(10) Patent No.: US 12,782,826 B2
(45) Date of Patent: Nov. 3, 2026

(54) MEASUREMENT APPARATUS, METHOD FOR OPERATING A MASK-METROLOGY MEASUREMENT APPARATUS, AND COMPUTER PROGRAM PRODUCT

(71) Applicant: Carl Zeiss SMT GmbH, Oberkochen (DE)

(72) Inventors: Jan Reisloehner, Jena (DE); Thomas Frank, Jena (DE); Ulrich Matejka, Jena (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 304 days.

(21) Appl. No.: 18/421,242

(22) Filed: Jan. 24, 2024

(65) Prior Publication Data

US 2024/0255857 A1 Aug. 1, 2024

(30) Foreign Application Priority Data

Jan. 26, 2023 (DE) ........................ 102023101902.3

(51) Int. Cl.
*G06K 9/00* (2022.01)
*G03F 1/36* (2012.01)
(Continued)

(52) U.S. Cl.
CPC ............ *G03F 7/70508* (2013.01); *G03F 1/36* (2013.01); *G03F 7/70591* (2013.01); *G06T 5/50* (2013.01);
(Continued)

(58) Field of Classification Search
CPC ... G01N 2021/95676; G01N 2201/127; G01N 21/956; G01N 21/8851; G01N 2021/8887;
(Continued)

(56) References Cited

U.S. PATENT DOCUMENTS

2012/0162755 A1* 6/2012 Stroessner ................ G03F 1/84
359/385
2020/0401037 A1* 12/2020 Huang ................ G01N 21/956
(Continued)

FOREIGN PATENT DOCUMENTS

| | | | |
|---|---|---|---|
| CN | 113196173 | 7/2021 | G03F 7/20 |
| DE | 102011113940 | 3/2013 | G03F 7/20 |

(Continued)

OTHER PUBLICATIONS

Zibold, Axel Matthias, et al. "Using the aerial image measurement technique to speed up mask development for 193-nm immersion and polarization lithography." Advanced Microlithography Technologies. vol. 5645. SPIE, 2005. (Year: 2005).*
(Continued)

*Primary Examiner* — Avinash Yentrapati
(74) *Attorney, Agent, or Firm* — Fish & Richardson P.C.

(57) ABSTRACT

Method for operating a mask-metrology measurement apparatus, wherein an image of a section of a photomask is recorded with a first image sensor and wherein an aerial image is generated by virtue of the image raw data obtained with the image sensor being subjected to a clear normalization. The aerial image is subjected to a non-linearity adaptation, which comprises the following steps. In step a., the aerial image is mathematically combined with a clear image ($C_{T2T}$). In step b., linearity correction ($P_{lin1}$) is applied to the image data generated in step a. to correct a linearity error of the first image sensor. In step c., a non-linearity adaptation ($P^{-1}{}_{lin2}$) is applied to the linearity-corrected image data obtained in step b. to imprint a linearity signature of a second image sensor not arranged in the beam path of the measurement apparatus on the image data. In step d., a clear normalization is applied to the linearity-adapted image data generated in step c. The invention also relates to a mask-metrology measurement apparatus and to a computer program product.

20 Claims, 8 Drawing Sheets

(51) Int. Cl.

| | |
|---|---|
| ***G03F 7/00*** | (2006.01) |
| ***G06T 5/50*** | (2006.01) |
| ***G06T 7/00*** | (2017.01) |
| ***G06T 7/80*** | (2017.01) |

(52) U.S. Cl.
CPC .............. *G06T 7/0004* (2013.01); *G06T 7/80* (2017.01); *G06T 2207/30148* (2013.01)

(58) Field of Classification Search
CPC .......... G03F 1/36; G03F 1/84; G03F 7/70508; G03F 7/70591; G06T 7/80; G06T 5/50; G06T 7/0004; G06T 2207/30148
See application file for complete search history.

(56) References Cited

U.S. PATENT DOCUMENTS

| | | | | |
|---|---|---|---|---|
| 2021/0255541 | A1* | 8/2021 | Simakov | G03F 1/84 |
| 2022/0028052 | A1* | 1/2022 | Li | G06N 3/08 |
| 2022/0075272 | A1* | 3/2022 | Matejka | G02B 21/0016 |
| 2024/0119582 | A1* | 4/2024 | Zhang | G03F 1/36 |

FOREIGN PATENT DOCUMENTS

| | | | |
|---|---|---|---|
| JP | 2006-275780 | 10/2006 | G01N 21/956 |
| JP | 2012-002680 | 1/2012 | G01N 21/956 |
| JP | 2013-504774 | 2/2013 | G03F 1/84 |
| JP | 2022-537342 | 8/2022 | G03F 1/84 |
| KR | 10-2021-0105838 A | 8/2021 | |
| TW | 202303264 | 1/2023 | G03F 1/36 |
| WO | WO 2018/029184 | 2/2018 | G03F 1/72 |
| WO | WO 2022/248216 | 12/2022 | G03F 1/84 |

OTHER PUBLICATIONS

Office Action in Korean Appln. No. 10-2024-0010071, mailed on Oct. 24, 2025, 16 pages (with English translation).
Office Action issued by the Japanese Patent Office for Application No. JP 2024-009187, dated Feb. 6, 2025 (with English Translation).

* cited by examiner

MEASUREMENT APPARATUS, METHOD FOR OPERATING A MASK-METROLOGY MEASUREMENT APPARATUS, AND COMPUTER PROGRAM PRODUCT

CROSS-REFERENCE TO RELATED APPLICATION

This application claims priority under 35 U.S.C. § 119 from German Patent Application 10 2023 101 902.3, filed on Jan. 26, 2023, the entire content of which is incorporated herein by reference.

TECHNICAL FIELD

The invention relates to a measurement apparatus, to a method for operating a mask-metrology measurement apparatus, and to a computer program product.

BACKGROUND

Photomasks are used in microlithographic projection exposure apparatuses, which are used to produce integrated circuits with particularly small structures. The photomask (=reticle) illuminated by very short-wave deep ultraviolet or extreme ultraviolet radiation (DUV or EUV radiation) is imaged onto a lithography object in order to transfer the mask structure to the lithography object.

For a high quality of the image representation generated on the lithographic object, it is crucial that photomasks that exactly match the specifications are used. Mask-metrology measurement apparatuses are used to examine photomasks so that a statement can be made about the dimensional accuracy of the photomask.

In the mask-metrology measurement apparatus, a section of the photomask is illuminated with radiation emitted by a radiation source and the illuminated section of the photomask is imaged on an image sensor. The image raw data obtained with the image sensor is set in relation to a clear image, i.e. an image that is free from any mask structure. A clear image can be generated, for example, by approaching a clear position of the photomask in which the radiation can pass through the glass substrate of the photomask without being influenced by a mask structure. An image recording that has been subjected to a clear normalization is hereinafter referred to as an aerial image.

After several years of operation, it may be necessary to replace the image sensor of the measurement apparatus. Since the non-linearity behaviours of two image sensors are generally not identical, the aerial images that the user receives after the image sensor has been replaced differ from the aerial images before the replacement. This is undesirable because many users have set routines when it comes to the further processing of the aerial images. These routines can be adversely affected if there are deviations between the aerial images.

SUMMARY

The invention is based on the aspect of presenting a method for operating a mask-metrology measurement apparatus, a measurement apparatus and a computer program product, so that the measurement results after the replacement of the image sensor correspond to the measurement results before the replacement of the image sensor. The aspect is achieved by the features of the independent claims. Advantageous embodiments are specified in the dependent claims.

In the method according to the invention for operating a mask-metrology measurement apparatus, an image of a section of a photomask is recorded with a first image sensor. An aerial image is generated by virtue of the image raw data obtained with the first image sensor being subjected to a clear normalization. The aerial image is subjected to a non-linearity adaptation, which comprises the following steps. In step a., the aerial image is mathematically combined with a clear image. In step b., linearity correction is applied to the image data generated in step a. to correct a linearity error of the first image sensor. In step c., a non-linearity adaptation is applied to the linearity-corrected image data obtained in step b. to imprint a linearity signature of a second image sensor not arranged in the beam path of the measurement apparatus on the image data. In step d., a clear normalization is applied to the linearity-adapted image data generated in step c.

The invention has recognized that accuracy and repeatability losses occur when linearity adaptations ascertained for the old image sensor and the new image sensor are applied directly to the raw images. The invention proposes to correct the clear-normalized aerial image. In this way, a better match between measurement results obtained with the old image sensor prior to replacing the image sensor and measurement results recorded with the new image sensor can be attained. For the purposes of the invention, the new image sensor corresponds to the first image sensor. The old image sensor corresponds to the second image sensor not located in the beam path of the measurement apparatus.

Clear normalization sets measured image data in relation to clear image data. Clear image data are obtained by the beam path being guided through a glass substrate without structure, in particular through a clear position of the photomask. The clear image data thus provide information about what the image sensor sees when the radiation emitted by the radiation source is guided directly to the image sensor without the structure to be examined. Clear normalization can be used to prevent the measurement results from being falsified by image sensor drift, and the illumination field inhomogeneity is calibrated. The clear normalization is done pixel by pixel, so the ratio of the image data of the image recording and the image data of the clear image is formed for each pixel of the image sensor.

The mathematical combination of the aerial image with a clear image according to the invention can also be carried out pixel-by-pixel by multiplying image data measured for each pixel of the image sensor by a clear measurement value of the same pixel. The multiplication can be done in normalized units, for example on a scale ranging from 0 to 1. A value of 1 may correspond to a saturation of the image sensor. The measurement apparatus may be adjusted such that a clear image has an average intensity between 0.5 and 0.9, preferably a value between 0.6 and 0.8 on the relative scale.

The clear image used for the calculation, which is hereinafter referred to as the clear image $C_{T2T}$, can be a clear image recorded with the new image sensor. For example, the clear image $C_{T2T}$ may be the first clear image recorded in a measurement series. A linearity error of the new image sensor affects the clear image $C_{T2T}$ in the same way as other image data recorded with the new image sensor. In one embodiment, a non-linearity adaptation is also carried out in the clear image $C_{T2T}$ before the clear image $C_{T2T}$ is used for the clear normalization of the linearity-adapted image data.

The clear image $C_{T2T}$ can be subjected to a linearity correction to correct a linearity error of the first image sensor. The first linearity correction can be the same first linearity correction to which the non-linearity-corrected measured image data are also subjected.

The clear image $C_{T2T}$ can be subjected to a non-linearity adaptation to imprint a linearity signature of the second image sensor on the clear image C-r. The second non-linearity adaptation can be the same non-linearity adaptation to which the linearity-corrected image data of the image recording are subjected.

In a preceding method step, which may also be a constituent part of the method according to the invention, a measurement may have been carried out to ascertain the linearity error of the first image sensor. For this purpose, a relationship can be established between an amount of radiation incident on the first image sensor and the image data that the first image sensor generates therefrom. The amount of radiation guided to the first image sensor can be varied in a relatively large number of measurements between zero and the saturation of the first image sensor and from this a relationship can be derived as to what amount of radiation corresponds to which output signal of the first image sensor.

To vary the amount of radiation guided to the first image sensor during a first image sensor recording, either the radiant power or the exposure time can be adapted. If the radiant power is kept constant and the exposure time varies, this has the advantage that linearity errors of an energy monitor can be blocked out. A beam splitter can be arranged in the beam path of the measurement apparatus so that a portion of the incident radiation is guided to the energy monitor. If the radiant power is kept constant and the exposure time varies, this has the advantage that linearity errors of the energy monitor do not matter because the measurement values of the energy monitor remain constant.

If the first image sensor has a linearity error, a linear increase in the amount of radiation received during an exposure operation results in a non-linear increase in the output signal. For the linearity correction, a first calculation rule with which the non-linear profile of the output signal can be converted into a linear profile is ascertained. The first calculation rule can be in the form of a polynomial. The polynomial can be a polynomial between the second order and the eighth order, in particular it can be a polynomial of the fifth order. A first calculation rule obtained by performing one or more of the steps above can be applied to the image data for applying a linearity correction to the image data.

A calculation rule for the linearity error of the second image sensor can be ascertained in a corresponding manner. In particular, a relationship can be established between an amount of radiation incident on the second image sensor and the image data that the second image sensor generates therefrom. The amount of radiation guided to the second image sensor can be varied in a relatively large number of measurements between zero and the saturation of the second image sensor and from this a relationship can be derived as to what amount of radiation corresponds to which output signal of the second image sensor.

To vary the amount of radiation guided to the second image sensor during a second image sensor recording, either the radiant power or the exposure time can be adapted. If the radiant power is kept constant and the exposure time varies, this has the advantage that linearity errors of an energy monitor can be blocked out. A beam splitter can be arranged in the beam path of the measurement apparatus so that a portion of the incident radiation is guided to the energy monitor. If the radiant power is kept constant and the exposure time varies, this has the advantage that linearity errors of the energy monitor do not matter because the measurement values of the energy monitor remain constant.

If the second image sensor has a linearity error, a linear increase in the amount of radiation received during an exposure operation results in a non-linear increase in the output signal. For the linearity correction, a second calculation rule with which the non-linear profile of the output signal can be converted into a linear profile is ascertained. The second calculation rule can be in the form of a polynomial. The polynomial can be a polynomial between the second order and the eighth order, in particular it can be a polynomial of the fifth order. A second calculation rule obtained by performing one or more of the steps above can be applied to the image data in inverse manner for applying a non-linearity correction to the image data.

In many cases, it will be useful to ascertain the linearity correction for the second image sensor before the linearity correction for the first image sensor, because the second (old) image sensor will have been installed from the beginning, while the first (new) image sensor is yet to be installed.

In the method according to the invention, the first calculation rule for the linearity error of the first image sensor is applied directly such that the non-linear image data are converted into linear image data. The second calculation rule for the linearity error of the second image sensor, on the other hand, is applied in the inverse form such that a linearity signature of the second image sensor is imprinted on the image data which are linear after the application of the first linearity correction.

The linearity-adapted image data obtained by applying a non-linearity adaptation to the linearity-corrected image can be clear-normalized. This means that the linearity-adapted image data is set in relation to a clear image, i.e. an image that is free from any mask structure. A clear image can be generated, for example, by obtaining clear image data form a clear position of the photomask in which the radiation can pass through the glass substrate of the photomask without being influenced by a mask structure. The clear image data can be obtained with the first image sensor.

The radiation guided to the first or second image sensor can be generated using a radiation source. The radiation source can be a laser radiation source. If the laser radiation source emits radiation pulses of constant energy, the amount of radiation guided to the first or second image sensor during an exposure operation can be ascertained by summing up the energy of the radiation pulses. The energy monitor shows a similar measurement value for each of the radiation pulses. Despite the same radiation pulses, the measurement values will generally not be totally identical because the measurement values are subject to noise. Any non-linearity of the energy monitor does not affect the measurement. Alternatively, a lamp capable of keeping the radiant power emitted constant can be used as the radiation source. Again, the amount of radiation received by the first or second image sensor can in this way be set by changing the exposure time.

An aerial image obtained with the first image sensor can be an energy-normalized aerial image. For this purpose, both the image data of the image recording obtained with the first image sensor and the image data of the clear image used in the clear normalization can be energy-normalized. Energy-normalized means that the raw data recorded with an image sensor are set in relation to the amount of radiation used for recording. The amount of radiation used for the recording can be ascertained using an energy monitor as described above.

When recording aerial images, it is possible to proceed in such a way that a plurality of image recordings are taken after the recording of a clear image. Up to now, it has been customary to effect the clear normalization of the measurement recordings based on the last previously recorded clear image. As a standalone inventive solution which can be applied independently of the described non-linearity adaptation, it is proposed to use a first clear image and a second clear image for the clear normalization, wherein the first clear image is recorded temporally before the measurement recordings and the second clear image temporally after the measurement recordings.

Between the first clear image and the second clear image, an interpolation can be effected over the time between the average intensity of the first clear image and the average intensity of the second clear image. The interpolation corresponds to a time profile of the clear state of the image sensor between the time point of the first clear image and the time point of the second clear image. A clear state derived from the interpolation can be used for the clear normalization of a measurement recording. It is advantageous if the interpolated clear state corresponds to the same time point at which the image recording was recorded.

The interpolation between the first clear image and the second clear image can be a linear interpolation. A higher-order interpolation is also possible, but in many cases does not lead to a much better effect.

A further deviation between the first image sensor and the second image sensor may result from the fact that the point-imaging properties of the image sensors are different. This means that a point-shaped object does not result in an exact point-shaped image representation on the image sensor and that the spread of the point-shaped object is different for the first image sensor than for the second image sensor. The deviation can be mathematically described by a modulation transfer function MTF. In the method according to the invention, a first modulation transfer function MTF1 can be ascertained for the first image sensor and a second modulation transfer function MTF2 can be ascertained for the second image sensor. The modulation transfer function can be ascertained, for example, by imaging different structures on an image sensor and by deducing therefrom a correction of the image sensor.

The correction can be effected by applying the modulation transfer function MTF1 to the image data recorded with the first image sensor. Unlike linearity correction, the correction of the point-imaging properties is not done pixel-by-pixel, but rather as a correction in the frequency or Fourier domain over the entire area of the image sensor. In the further course of the method according to the invention, the inverse modulation transfer function $MTF2^{-1}$ can be applied to the image data for correcting deviations resulting from different point-imaging properties of the first image sensor and the second image sensor. The first modulation transfer function MTF1 can be applied before or after the linearity correction. The second modulation transfer function $MTF2^{-1}$ can be applied before or after the non-linearity adaptation.

A correction of a linearity error of the energy monitor can also be carried out in the method according to the invention. For this purpose, it is expedient in a preceding method step to ascertain the linearity error of the energy monitor by passing signals to the energy monitor over the bandwidth of the energy monitor and by determining the ratio between radiation incident on the energy monitor and the measurement value of the energy monitor ascertained therefrom. Image data recorded with an image sensor can be used as a reference for the comparison. In order to block out any linearity error of the image sensor, the exposure time of the image sensor can be adapted such that the amount of radiation incident on the exposure sensor during an exposure operation remains constant. This means that in a measurement operation during which a large amount of radiation is guided to the energy monitor, the exposure time of the image sensor is kept short. The lower the amount of radiation on the energy monitor becomes, the longer the exposure time of the image sensor can be. Linearity-corrected measurement values of the energy monitor can be used for the energy normalization of the aerial image.

There are measurement apparatuses in which the image data recorded with the old image sensor have already been subjected to a correction. These corrections, which may for example be due to an adaptation to yet another image sensor having been performed at an earlier time point, are referred to below as default correction. The method according to the invention can be carried out in such a way that the default correction is applied inversely after mathematically combining the aerial image with the clear image $C_{T2T}$ and before applying the linearity correction. After the non-linearity adaptation has been completed, the default correction can be performed again.

The invention also relates to a mask-metrology measurement apparatus comprising an image sensor, a calculation module and a correction module. The image sensor is designed to record an image of a section of a photomask. The calculation module is designed to generate an aerial image by subjecting the image raw data obtained using the image sensor to a clear normalization. The correction module is designed to subject the aerial image to a non-linearity adaptation. The non-linearity adaptation consists of the following steps. In step a., the aerial image is mathematically combined with a clear image. In step b., linearity correction is applied to the image data generated in step a. to correct a linearity error of the first image sensor. In step c., a non-linearity adaptation is applied to the linearity-corrected image data obtained in step b. to imprint a linearity signature of a second image sensor not arranged in the beam path of the measurement apparatus on the image data. In step d., a clear normalization is applied to the linearity-adapted image data generated in step c.

The invention also relates to a computer program product or a set of computer program products comprising program parts which, when loaded into a computer or into networked computers connected to a measurement apparatus according to the invention, are designed to carry out the method according to the invention.

The disclosure encompasses developments of the mask-metrology measurement apparatus with features that are described in the context of the method according to the invention. The disclosure comprises developments of the method which are described in the context of the mask-metrology measurement apparatus according to the invention.

The invention is described by way of example hereinafter using advantageous embodiments, with reference to the appended drawings.

DETAILED DESCRIPTION

A mask-metrology measurement apparatus according to the invention is used to examine the structure of a photomask 17. The photomask 17 is intended for use in a microlithographic projection exposure apparatus (not shown). In the microlithographic projection exposure apparatus, the photomask 17 is illuminated with deep-ultraviolet radiation (DUV radiation) having a wavelength of, for example, 193 nm in order to image a structure formed on the photomask 17 onto the surface of a lithographic object in the form of a wafer. The wafer is coated with a photoresist that reacts to the DUV radiation. The measurement apparatus is used to examine whether the structure on the photomask 17 corresponds to the dimensional specifications.

Figure 1:
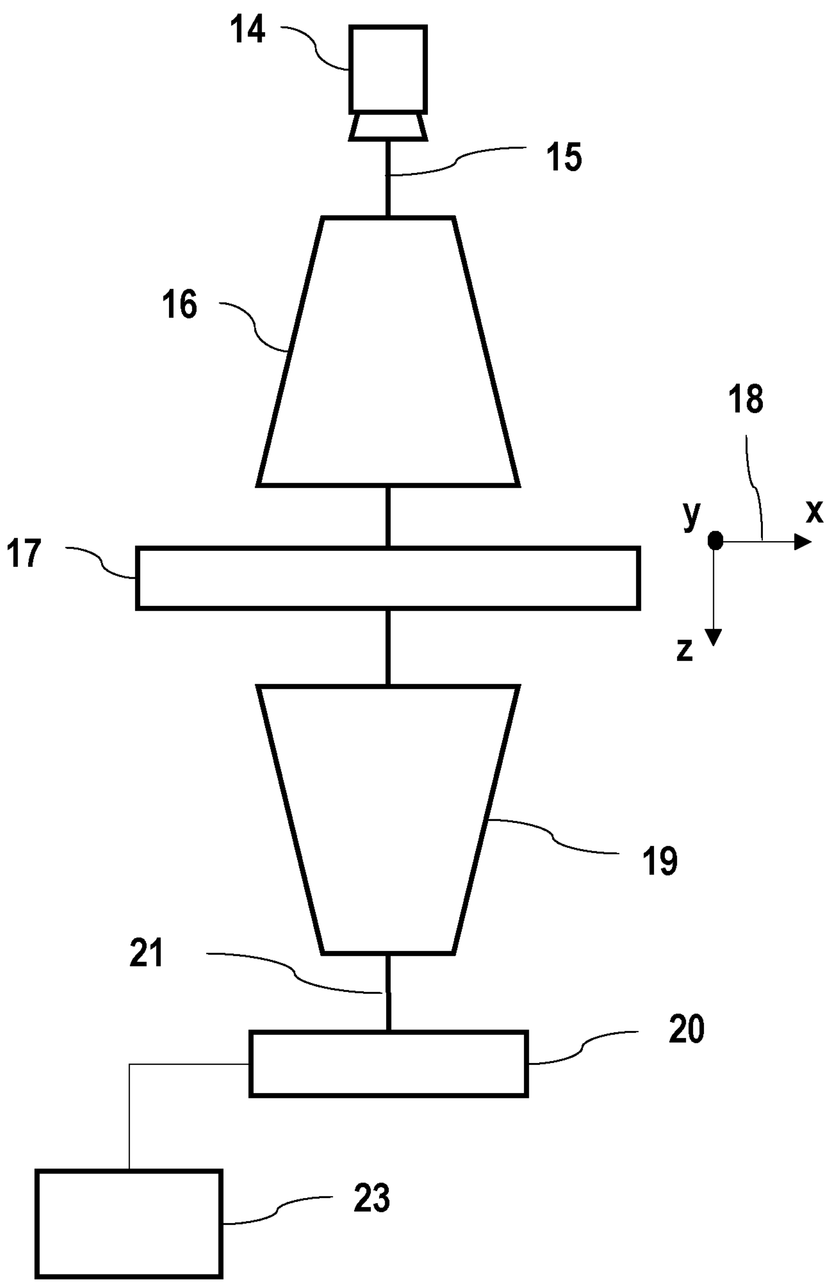
FIG. 1: shows a schematic illustration of a measurement apparatus according to the invention.
Figure 2:
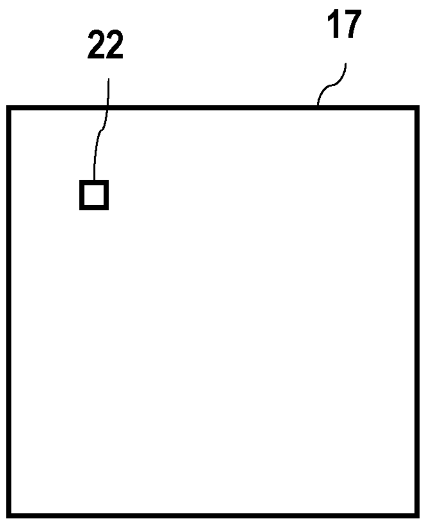
FIG. 2: shows a view from above of a photomask examined with the measurement apparatus from FIG. 1.
Figure 3:
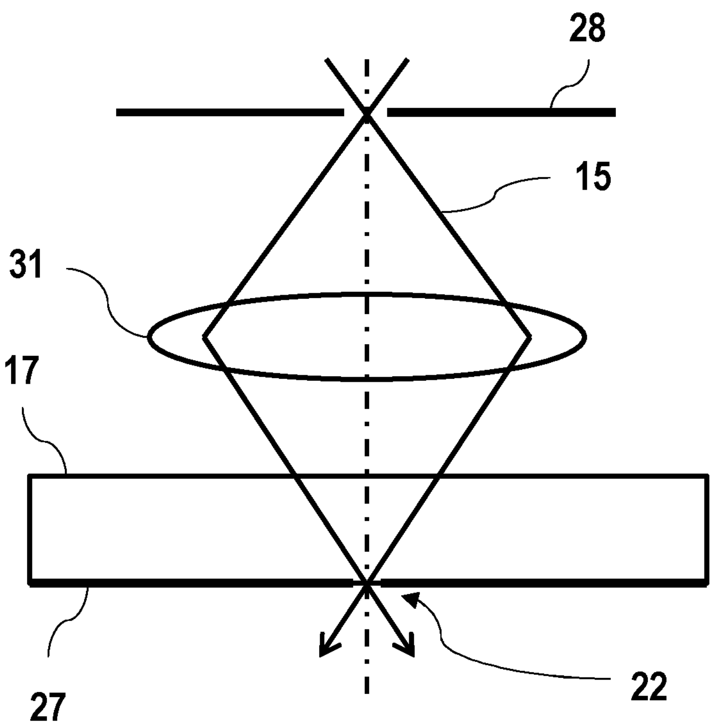
FIG. 3: shows a section of the beam path of the measurement apparatus from FIG. 1 in a schematic illustration.

In the measurement apparatus, the photomask 17 is arranged according to FIG. 1 in such a way that a beam path emanating from a laser radiation source 14 passes through the photomask 17 and is guided to an image sensor 20. The radiation has a wavelength of 193 nm, which corresponds to the DUV radiation used in the microlithographic projection exposure apparatus. Arranged between the laser radiation source 14 and the photomask 17 is an illumination system 16 with which the laser beam emitted by the laser radiation source 14 is expanded such that it uniformly illuminates a measuring field 22 within the surface of the photomask 17, see FIG. 2. Using an imaging system 19, the structure of the photomask 17 is imaged onto an image sensor 20. The portion of the beam path between the laser radiation source 14 and the photomask 17 is referred to as the illumination beam path 15. The portion of the beam path between the photomask 17 and the image sensor 20 is referred to as the imaging beam path 21.

The photomask 17 is arranged in the measurement apparatus on an X-Y positioner 18, which is schematically indicated in FIG. 1. By moving the photomask 17 in the X-Y plane, the illumination beam path 15 can be directed at different regions of the photomask 17. The measurement field 22 is limited by a field stop 28, on which the illumination beam path 15 is incident via a condenser optical unit 31.

Figure 4:
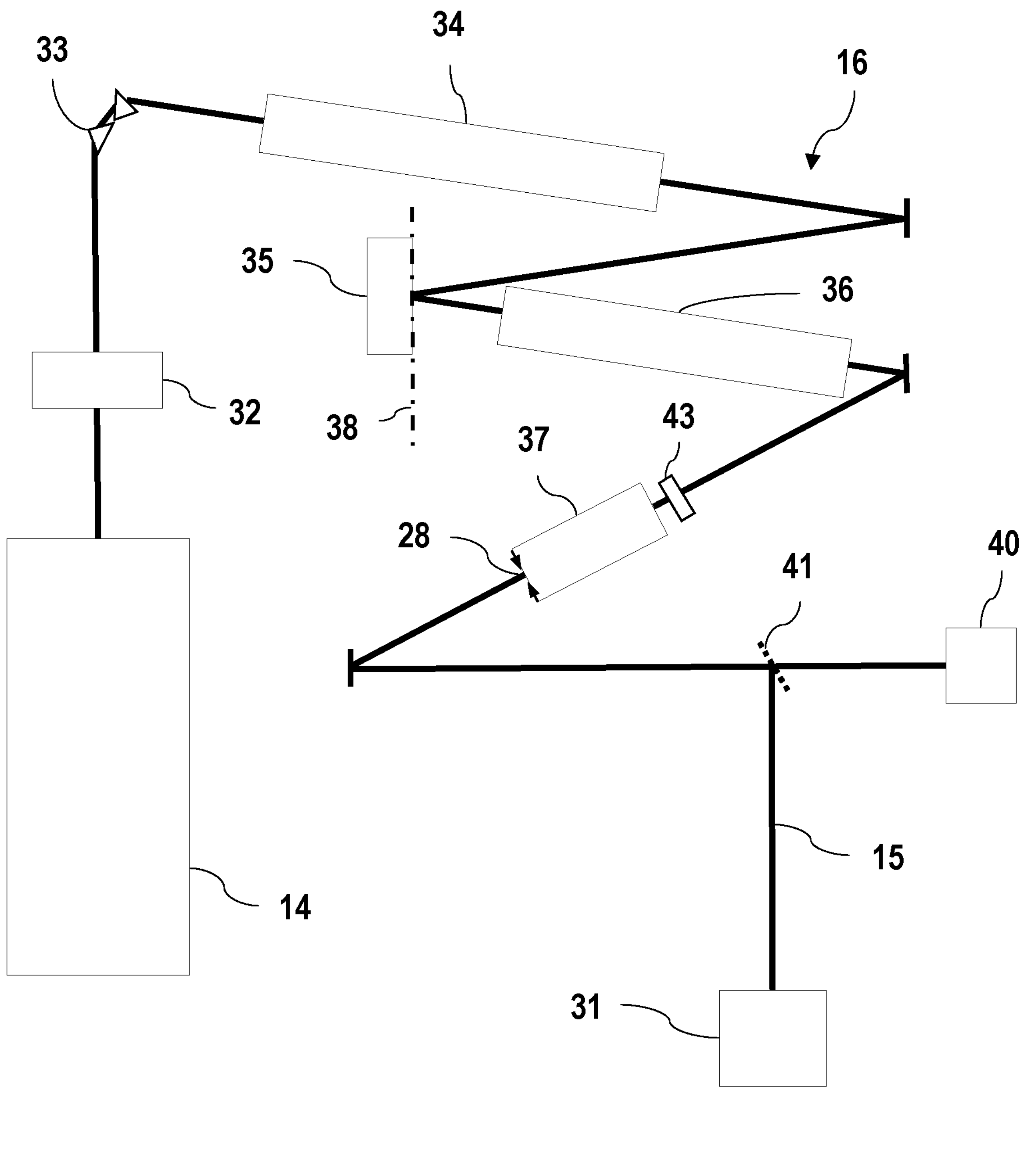
FIG. 4: shows a schematic illustration of the illumination beam path of the measurement apparatus from FIG. 1.

FIG. 4 schematically shows the illumination beam path 15 between the laser radiation source 14 and the condenser optical unit 31. A laser beam emitted by the laser radiation source 14 is initially guided through a beam attenuator 32. The beam attenuator 32 is set such that the intensity of the laser beam is matched to the sensitivity of the image sensor 20. Using a prism arrangement 33, the illumination beam path 15 is deflected in the direction of a first optical assembly 34, with which the exit opening of the laser beam source 14 is imaged onto a pupil-shaping mirror element 35. The pupil-shaping mirror element 35 may be a mirror array comprising a multiplicity of mirror elements which are movably suspended on a frame structure and whose orientation relative to the frame structure can be individually set.

The pupil-shaping mirror element or mirror array 35 is arranged in a pupil plane 38 of the illumination system 16 such that reflected radiation is distributed with uniform intensity over the measurement field 22 on the photomask 17. By adjusting the pupil-shaping mirror element or the mirror elements, the illumination setting can be varied, i.e. the angle distribution at which the radiation is incident on the measurement field 22.

Using a second optical assembly 36, the illumination radiation is transmitted to a third optical assembly 37. The third optical assembly 37 comprises a diffractive optical element in the form of a field DOE 43, with which the field is generated, and a field stop 28, with which the measurement field 22 is defined. In a beam splitter 41, the illumination beam path 15 is divided such that a first part of the radiation is guided via the condenser optical unit 31 to the photomask 17 and that a second part of the radiation is guided to an energy monitor 40.

The illumination radiation is divided between the energy monitor 40 and the condenser optical unit 31 at a fixed ratio, with the result that the measurement values of the energy monitor 40 form a measure for the amount of radiation that is incident on the photomask 17 via the condenser optical unit 31. Based on the measurement values of the energy monitor 40, the image data recorded with the image sensor 20 can be subjected to an energy normalization.

For the examination of a photomask 17, a multiplicity of images are recorded in a time sequence with the image sensor 20. The photomask 17 is moved between the recordings using the X-Y positioner 18 such that different regions of the photomask 17 are examined.

At regular time intervals of, for example, 15 minutes, a clear image is recorded in which the beam path passes through a clear position of the photomask 17, which is free from structuring. A clear image provides a reference for the measurement by recording an image that is not influenced by structures arranged in the beam path. The clear images can be used to perform a clear normalization of recorded image data such that the influence of drift on the image data is reduced. An image generated by clear normalization of image raw data is called an aerial image. The measurement apparatus comprises a calculation module 23 in which image raw data recorded with the image sensor 20 are subjected to a clear normalization in order to generate an aerial image.

Until now, it has been customary to use for the clear normalization the last clear image recorded before the image recording to be normalized. For the clear normalization, a relationship is formed between the raw data of the image recording and the clear image. Clear normalization can be performed in normalized units on a scale ranging from digits 0 to 1. In this case, 0 corresponds to the value that the image sensor 20 provides when the laser light source 14 is inactive, or when no radiation from the illumination system 16 is guided in the direction of the image sensor 20. The value 1 corresponds to the value provided by the image sensor 20 in the saturated state. For example, the average intensity of a clear image can be 0.7. The average intensity of an image recording is lower than the intensity of the clear image.

A drift of the image sensor 20 can cause the average clear intensity to change significantly between two clear images.

A change in the clear image used for the clear normalization can therefore result in an abrupt change between two consecutive aerial images.

Figure 5:
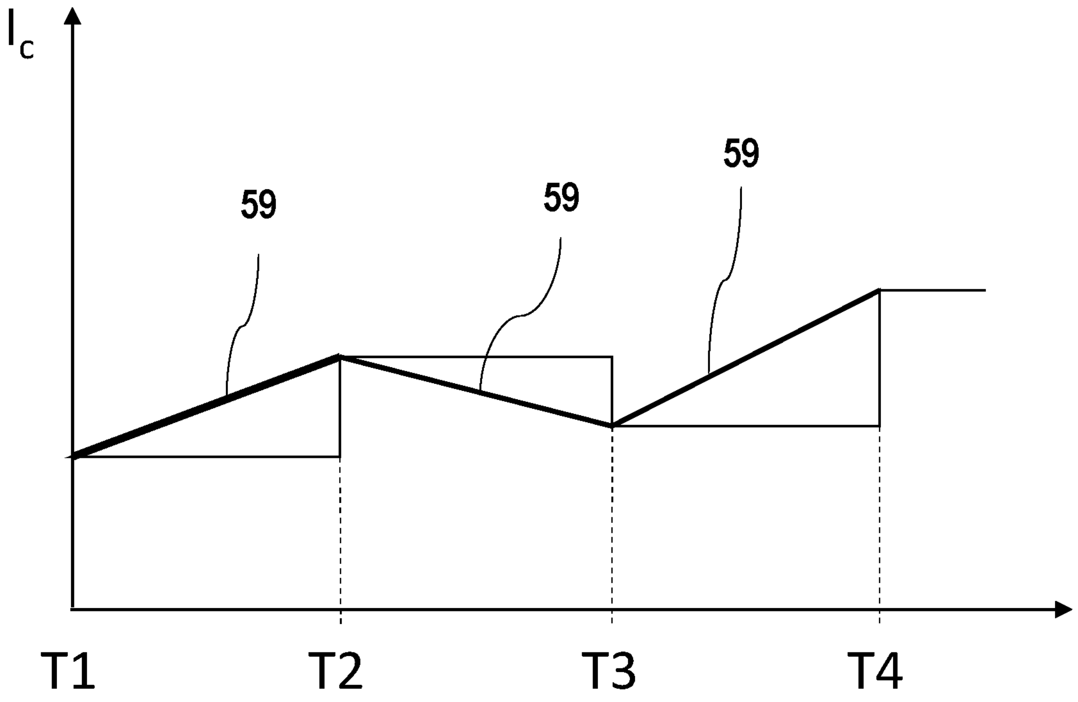
FIG. 5: shows the average intensity of a plurality of successively recorded clear images and a clear interpolation derived therefrom.

According to the invention, it is proposed to perform a clear interpolation between two consecutive clear images. For this purpose, the average intensity of a first clear image recorded at a time point T1 and of a second clear image recorded at a second time point T2 is ascertained and a linear interpolation is carried out, which extends between the time points T1 and T2. In FIG. 5, the average intensity $I_C$ of clear images which were recorded at four time points T1, T2, T3, T4 is shown as an example. The intervals between the clear images form the time periods for the linear clear interpolation 59, which is also shown in FIG. 5.

Figure 6:
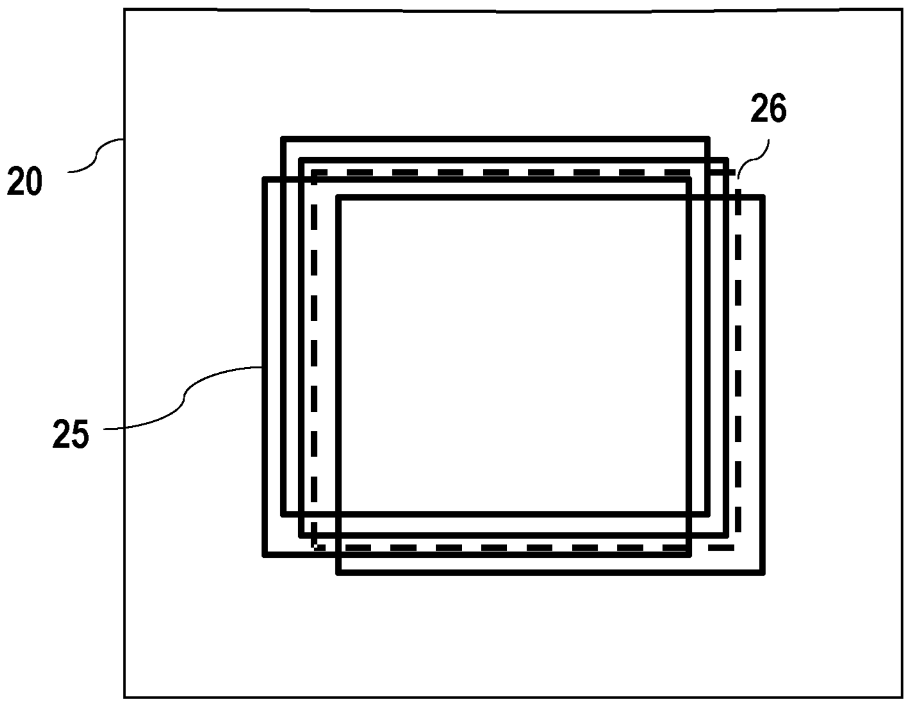
FIG. 6: shows various positions on the image sensor at which image representations of the measurement field can be produced.

An image representation 25 of the measurement field 22 produced on the image sensor 20 does not fill the entire area of the image sensor 20, see FIG. 6. The position of the image representation 25 on the image sensor 20 also shifts depending on the position of the measurement field 22 on the photomask 17. Various possible positions of the image representation 25 on the image sensor 20 are shown in FIG. 6. The average clear intensity $I_C$, which forms the basis for the clear interpolation, is ascertained by use of a section 26 which is cropped to the target image size and arranged centrally on the image sensor 20.

A clear correction factor $F_{C1}$ can be read from the clear interpolation for each time point T in the respective time interval. The image correction is carried out by dividing the aerial image (AI) obtained at time point T with the measurement apparatus pixel by pixel by the clear correction factor $F_{C1}$ applicable at time point T. The result is a corrected aerial image $AI_{C1}$.

$$AI_{CI} = \frac{AI}{F_{CI}}$$

After prolonged use of a measurement apparatus according to the invention, it may be necessary to replace the image sensor installed in the measurement apparatus with a new image sensor. If possible, this should be done in such a way that there is no change for the user of the measurement apparatus, that is to say that the measurement result with the new image sensor looks exactly the same as the measurement result with the old image sensor. This correspondence does not occur by itself, because in general the linearity errors of two image sensors are not the same.

In order to ascertain the linearity error of an image sensor 20, a sequence of exposure operations can be carried out in which the bandwidth of the image sensor 20 from zero incident radiation to the saturation of the image sensor 20 is covered. A measure of the actual amount of radiation incident on the image sensor 20 is obtained from the measurement values $E_{mon}$ of the energy monitor 40. In order to avoid that the measurement of the image sensor 20 is falsified by a linearity error of the energy monitor 40, the exposure operations can be carried out such that the energy monitor 40 measures a constant value so that a possible linearity error of the energy monitor 40 has no effect.

For this purpose, the laser beam source 14 of the measurement apparatus can be set such that it emits laser pulses with constant energy. The energy monitor 40 always sees the same amount of radiation when such a laser pulse is incident. The amount of the radiation incident on the image sensor 20 can be varied by changing the number of laser pulses during an exposure operation. The energy monitor 40 then supplies a measurement value $E_{mon}$, which corresponds to the sum of all radiation pulses.

Figure 8:
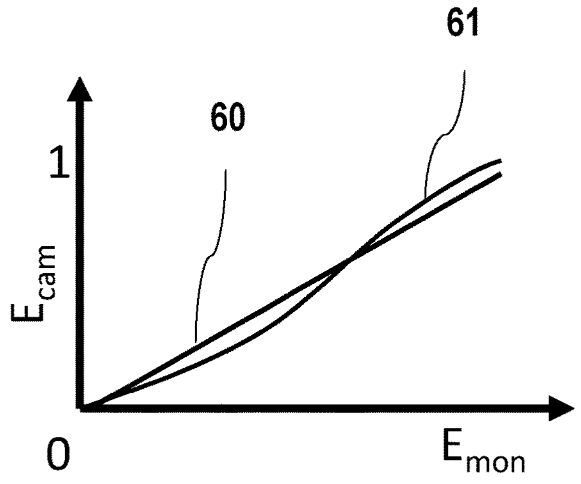
FIG. 8: shows an illustration of the linearity error of the image sensor.
Figure 9:
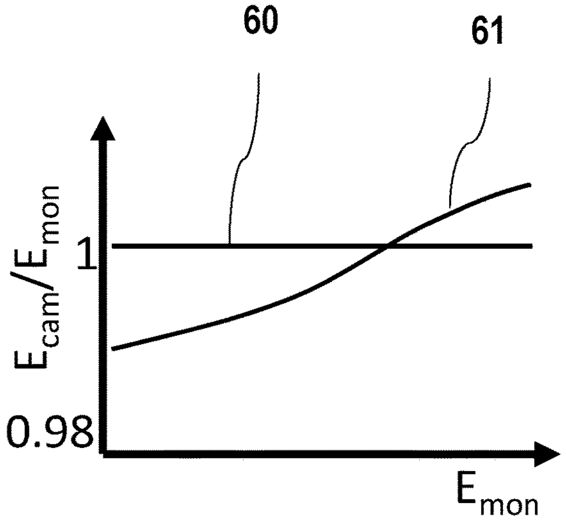
FIG. 9: shows the linearity error from FIG. 8 in another illustration.

The measurement series can begin with zero laser pulses to ascertain which measurement value $E_{cam}$ the image sensor 20 provides without incident radiation. The number of laser pulses can be incrementally increased until the saturation of the image sensor 20 is reached. An ideal image sensor 20 would provide measurement values $E_{cam}$ which increase linearly with $E_{mon}$, i.e. with the number of laser pulses, see FIG. 8. A real image sensor 20 deviates from the ideal profile 60. In FIG. 8, this is indicated by a curve 61 which lies in the lower region below and in the upper region above the ideal linear profile. In FIG. 9, the same linearity error between an ideal profile 60 and a real image sensor curve 61 is once again shown as a relative quantity in relation to the incident amount of radiation $E_{mon}$.

For example, a correction function can be calculated in the form of a fifth-order polynomial, with which the non-linear profile of the measurement values $E_{cam}$ is converted into a linear profile. When replacing the image sensor, such correction functions can be ascertained for both the old image sensor and the new image sensor 20. The result is a first polynomial $P_{lin1}$ for the new image sensor 20 and a second polynomial $P_{lin2}$ for the old image sensor. As described in more detail below, these correction functions can be used to convert an image recording recorded with the new image sensor 20 as if it had been recorded with the old image sensor.

Figure 7:
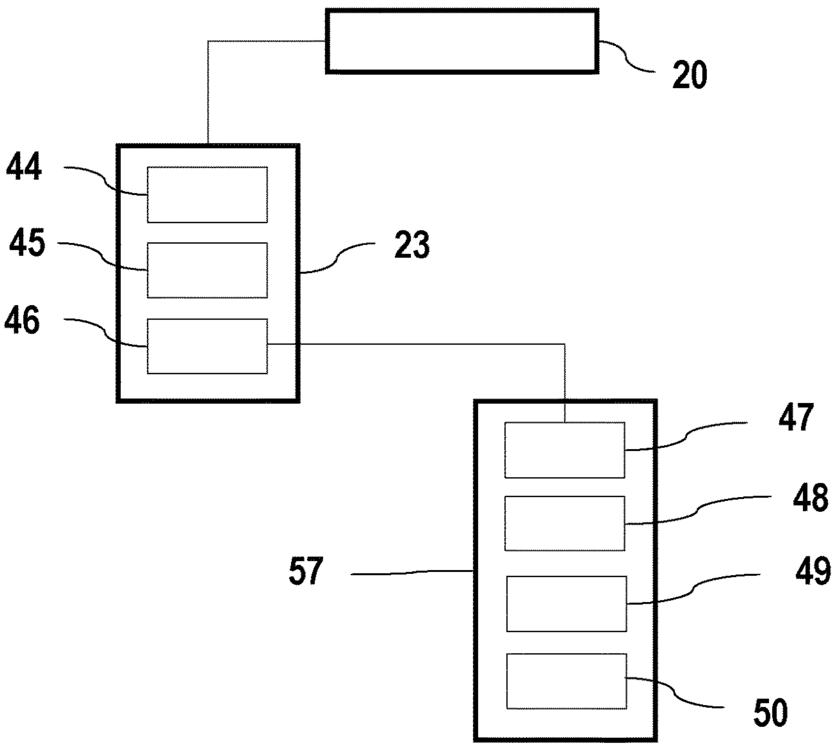
FIG. 7: shows a block diagram of a sequence of the method according to the invention.

FIG. 7 shows the image sensor 20, which stores the raw data in a buffer 44 of the calculation module 23. In a step 45, the raw data of the image recording are subjected to a clear normalization in order to generate an aerial image, which is stored in a memory 46. The aerial image is impacted by the linearity error of the image sensor 20 and therefore deviates from an aerial image that would have been produced if another image sensor had been used instead of the image sensor 20.

A correction module 57 is used for the image correction, which reads the image data of the aerial image from the memory 46. In a first step 47 of the image correction, the aerial image is mathematically combined with a clear image $C_{T2T}$. For example, the aerial image can be multiplied pixel by pixel by the clear image $C_{T2T}$. The clear image $C_{T2T}$ is a clear image recorded at the beginning of the measurement series, wherein a measurement series may start before T1 and end after T4 in FIG. 5. A single clear image $C_{T2T}$ may be recorded for the entire measurement series. The average intensity of the clear image $C_{T2T}$ is calibrated to a constant value stored in a database. This constant value corresponds to the average value of a clear image. For example, the average value of a clear image can be calculated by taking the average of the values of all the pixels in the clear image. The linearity error of the first image sensor 20 with which the raw data were recorded is removed in step 48 by the image data obtained from the aerial image being subjected to a linearity correction using the first polynomial $P_{lin1}$.

In a subsequent step 49, a non-linearity adaptation in the form of a second inverse linearity correction can be applied to imprint the linearity signature of the second image sensor on the linearity-corrected image data. To this end, the inverse second polynomial ${P^{-1}}_{lin2}$ is applied to the linearity-corrected image data to generate linearity-adapted image data from which the linearity error of the first image sensor 20 has been calculated out and on which the linearity signature of the second image sensor has been imprinted instead.

In order to generate an adapted aerial image from the adapted image data, a final clear normalization is carried out in step 50. In order to image the transition from the old image sensor to the new image sensor 20 as well as possible during the clear normalization, the clear image $C_{T2T}$ is subjected to a corresponding non-linearity adaptation. In a first step, the linearity error of the first image sensor 20 is thus calculated out of the clear image $C_{T2T}$ by applying the polynomial $P_{lin1}$. In a second step, the inverse polynomial $P^{-1}_{lin2}$ is applied to the linearity-corrected clear image $C_{T2T}$ to adapt the clear image $C_{T2T}$ to the linearity signature of the old camera to generate a linearity-adapted clear image $C_{T2T}$. To generate the linearity-adapted aerial image $AI_{T2T}$, the image data of the linearity-adapted image recording is divided by the linearity-adapted clear image $C_{T2T}$. Formulated as an equation, the linearity-adapted aerial image $AI_{T2T}$ results from the aerial image $AI_1$ recorded with the first image sensor 20 as follows:

$$AI_{T2T} = \frac{P_{lin2}^{-1}(P_{lin1}(AI_1 * C_{T2T}))}{P_{lin2}^{-1}(P_{lin1}(C_{T2T}))}$$

The linearity-adapted aerial image $AI_{T2T}$ can be output by the correction module 57 as a result of the measurement and made available for further use. For the user, the linearity-adapted aerial image $AI_{T2T}$ appears as if it had been recorded with the old image sensor, so that the user can continue to use their usual routines without modification.

Figure 10:
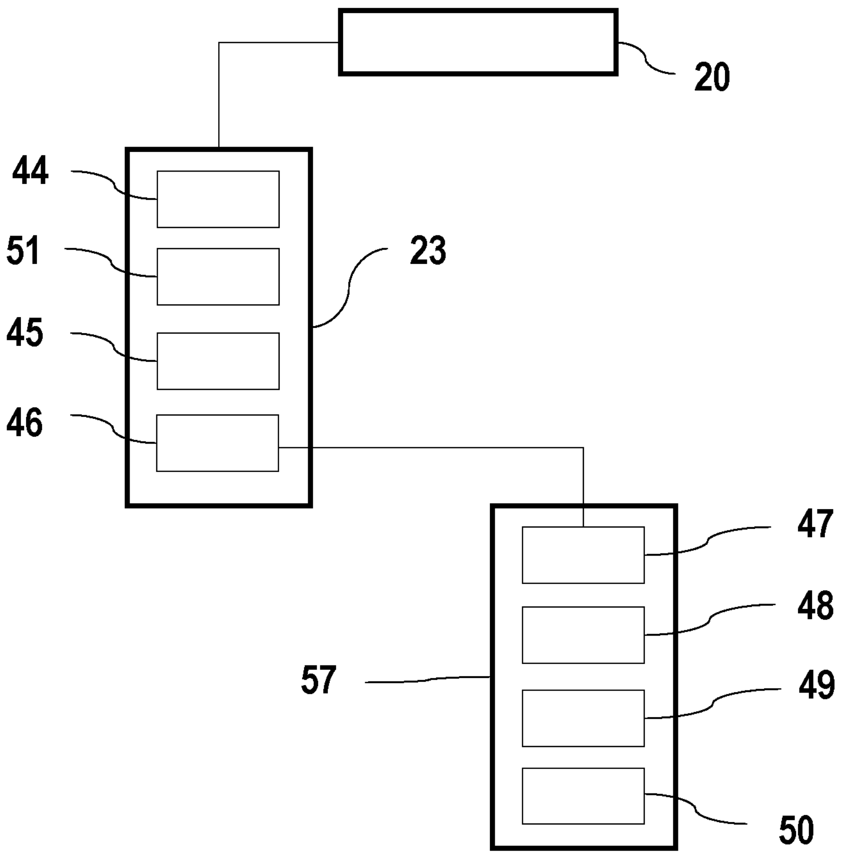
FIG. 10-12: show the view according to FIG. 7 in alternative embodiments of the invention.

In the alternative embodiment according to FIG. 10, an energy normalization is carried out in the calculation module 23 in an additional step 51. For this purpose, the raw data recorded with the image sensor 20 are set in relation to the measurement value of the energy monitor 40 at the time point of the image recording. Accordingly, the clear image used for the clear normalization can also be subjected to energy normalization. For this purpose, the clear image is set in relation to the measurement value of the energy monitor 40 at the time point at which the clear image was recorded. The result is an energy-normalized and clear-normalized aerial image, which is stored in the memory 46. With the image recording I, the clear image C, the energy normalization $E_I$ of the image recording and the energy normalization $E_C$ of the clear image, this can be represented as an equation as follows.

$$AI = \frac{I * E_C}{C * E_I}$$

During energy normalization, a linearity correction of the measurement values of the energy monitor 40 can also be taken into account. Similar to the image sensor, a correction function in the form of a polynomial can be ascertained herefor, with which the non-linear measurement values of the energy monitor 40 are converted into linear data. The required measurement data about the properties of the energy monitor 40 can be obtained by varying the energy measured by the energy monitor 40, while the image sensor 20 sees an unchanged amount of radiation. This can be achieved by reducing the exposure time of the image sensor 20 as the energy of the laser pulses increases. At the level of the correction module 57, a linearity correction of the energy normalization is not necessary because the errors in question are averaged out anyway when the image recording and the clear recording are set in relation to each other.

In a further variant, it is also taken into account that the new image sensor 20 and the old image sensor may have different point imaging properties. To correct this, a first modulation transfer function MTF1 can be ascertained for the new image sensor 20 and a second modulation transfer function MTF2 can be ascertained for the old image sensor.

Figure 11:
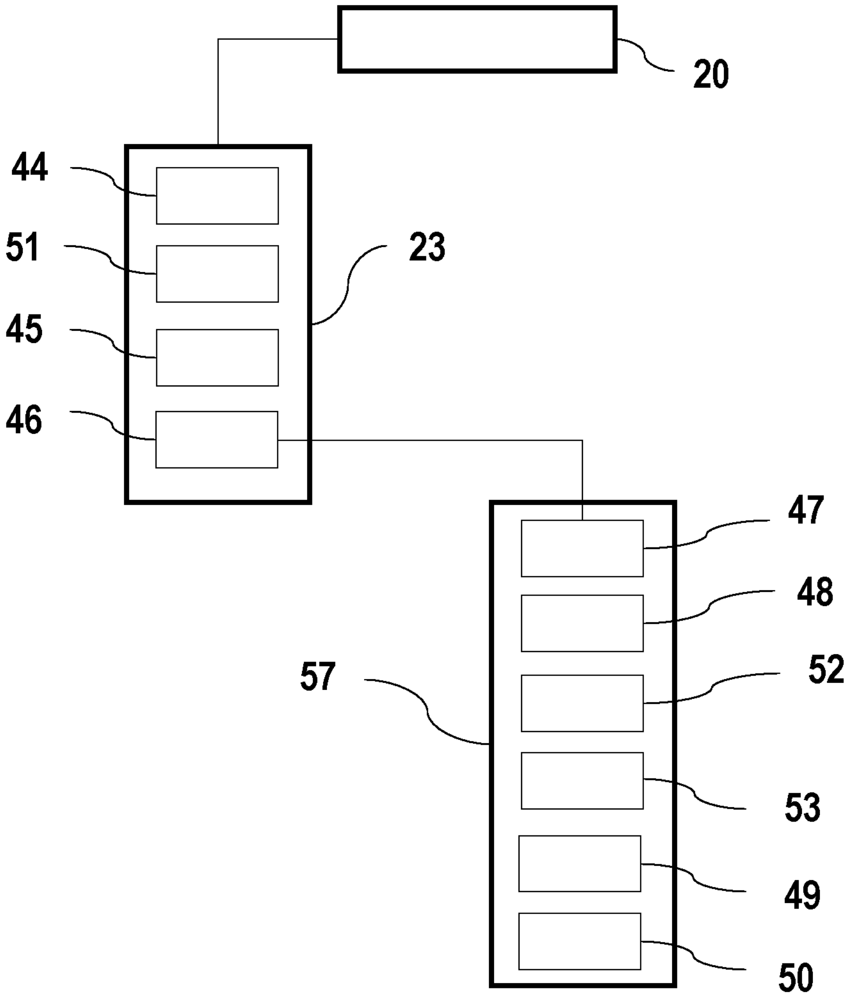

According to FIG. 11, two additional steps result from this in the correction module 57. Following the correction of the linearity error of the new image sensor 20 in step 48 and Fourier transformation into the frequency domain, the linearity-corrected image data in step 52 are divided by the modulation transfer function MTF1 to calculate out the point-imaging error of the new image sensor 20. Immediately afterwards, in step 53, a multiplication by the modulation transfer function MTF2 can be carried out in order to imprint the point-imaging error of the old image sensor on the image data. The inverse Fourier transformation back into the spatial domain then takes place. Alternatively, it would also be possible to correct the point-imaging error of the new image sensor 20 immediately after the image recording taking into account the Fourier transformation by dividing the raw data of the image recording directly by the modulation transfer function MTF1.

Figure 12:
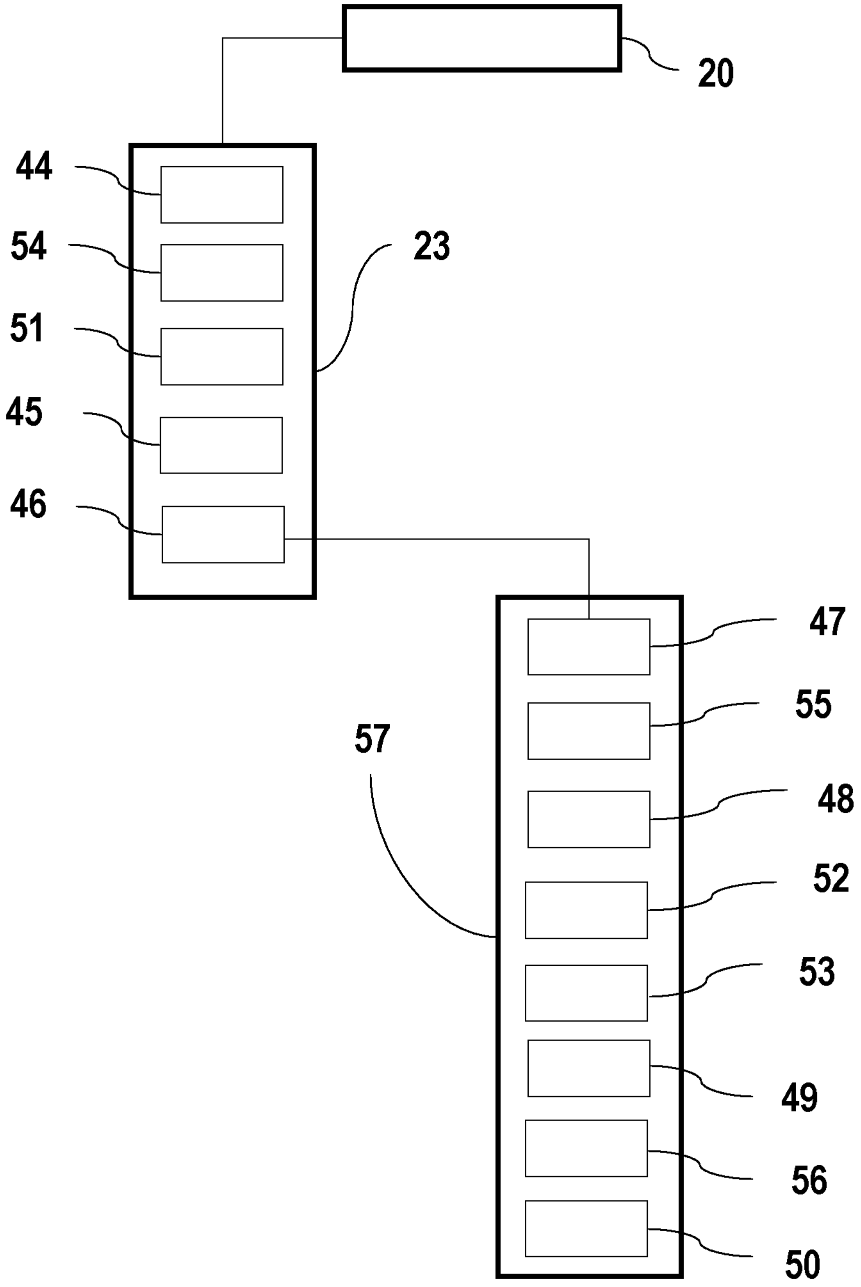

In a further embodiment, which is shown in FIG. 12, a default correction is carried out in the calculation module 23 in a further step 54. The default correction may have been introduced earlier in order to calculate out an inaccuracy that occurred when using the old image sensor. The default correction is mathematically described by a polynomial $P_{def}$.

In the inventive non-linearity adaptation, the result can be falsified by such a default correction. Therefore, the method can be performed so that the default correction is reversed by inverse application of the polynomial $P_{def}$ in step 55 before the linearity correction and by the default correction being repeated after the non-linearity adaptation in step 56. This can apply to both the image recording itself and to the clear image $C_{T2T}$. In mathematical representation, the linearity-adapted aerial image $AI_{T2T}$ is then obtained as follows.

$$AI_{T2T} = \frac{P_{def}\left(P_{lin2}^{-1}\left\{P_{lin1}\left[P_{def}^{-1}(AI_1 * C_{T2T})\right]\right\}\right)}{P_{def}\left(P_{lin2}^{-1}\left\{P_{lin1}\left[P_{def}^{-1}(C_{T2T})\right]\right\}\right)}$$

In this way, the method according to the invention can also be used if the image data of the old image sensor have already been subjected to a default correction.

The following are additional examples of the invention:

Example 1. A method comprising:

a. recording an image of a section of a photomask with a first image sensor and generating an aerial image by virtue of image raw data obtained with the first image sensor being subjected to a clear normalization;

b. subjecting the aerial image to a non-linearity adaptation comprising:

b1. mathematically combining the aerial image with a clear image ($C_{T2T}$);

b2. applying a linearity correction ($P_{lin1}$) to the image data generated in step b1. to correct a linearity error of the first image sensor to generate linearity-corrected image data;

b3. applying a non-linearity adaptation ($P^{-1}_{lin2}$) to the linearity-corrected image data obtained in step b2. to imprint a linearity signature of a second image sensor not arranged in the beam path of the measurement apparatus on the image data to generate linearity-adapted image data; and b4. applying a clear normalization to the linearity-adapted image data generated in step b3. to generate corrected photomask image data;

c. comparing the corrected photomask image data generated in step b4. to dimensional specifications for structures on the section of the photomask; and d. upon determining that a difference between dimensions of structures on the section of the photomask as shown in the corrected photomask image data and the dimensional specifications for structures on the section of the photomask is equal to or greater than a predetermined quality threshold, modifying the structures on the section of the photomask to generate modified structures on the section of the photomask.

Example 2. The method of example 1 wherein modifying the structures on the section of the photomask comprises directing an electron beam to the structures on the section of the photomask.

Example 3. The method of example 1, comprising: repeating the steps of a. to d. until a difference between dimensions of the structures on the section of the photomask as shown in the corrected photomask image data generated in step b4. and the dimensional specifications for structures on the section of the photomask is less than the predetermined quality threshold or until an end-of-iteration criterion has been met.

In some implementations, the image sensor 20 can include a charge-coupled device (CCD) sensor or a complementary metal-oxide semiconductor (CMOS) sensor. In some implementations, the calculation module 23 and/or the correction module 57 can include one or more computers that include one or more data processors configured to execute one or more programs that include a plurality of instructions according to the principles described above. Each data processor can include one or more processor cores, and each processor core can include logic circuitry for processing data. For example, a data processor can include an arithmetic and logic unit (ALU), a control unit, and various registers. Each data processor can include cache memory. In some examples, the calculation module 23 and the correction module 57 can be implemented in an integrated manner using one or more computers that include one or more data processors.

The processing of data described in this document, such as applying a clear normalization to raw data of image recording to generate an aerial image, mathematically combining an aerial image with a clear image, applying a linearity correction to the image data to correct a linearity error of a first image sensor, applying a non-linearity adaptation to the linearity-corrected image data to imprint a linearity signature of a second image sensor not arranged in the beam path of the measurement apparatus on the image data, and applying a clear normalization to the linearity-adapted image data, can be carried out using the calculation module 23 and the correction module 57.

The one or more computers can include one or more data processors for processing data, one or more storage devices for storing data, and/or one or more computer programs including instructions that when executed by the one or more computers cause the one or more computers to carry out the processes. The one or more computers can include one or more input devices, such as a keyboard, a mouse, a touchpad, and/or a voice command input module, and one or more output devices, such as a display, and/or an audio speaker. In some implementations, the one or more computing devices can include digital electronic circuitry, computer hardware, firmware, software, or any combination of the above. The features related to processing of data can be implemented in a computer program product tangibly embodied in an information carrier, e.g., in a machine-readable storage device, for execution by a programmable processor; and method steps can be performed by a programmable processor executing a program of instructions to perform functions of the described implementations. Alternatively or in addition, the program instructions can be encoded on a propagated signal that is an artificially generated signal, e.g., a machine-generated electrical, optical, or electromagnetic signal, that is generated to encode information for transmission to suitable receiver apparatus for execution by a programmable processor.

A computer program can be written in any form of programming language, including compiled or interpreted languages, and it can be deployed in any form, including as a stand-alone program or as a module, component, subroutine, or other unit suitable for use in a computing environment.

For example, the one or more computers can be configured to be suitable for the execution of a computer program and can include, by way of example, both general and special purpose microprocessors, and any one or more processors of any kind of digital computer. Generally, a processor will receive instructions and data from a read-only storage area or a random access storage area or both. Elements of a computer system include one or more processors for executing instructions and one or more storage area devices for storing instructions and data. Generally, a computer system will also include, or be operatively coupled to receive data from, or transfer data to, or both, one or more machine-readable storage media, such as hard drives, magnetic disks, solid state drives, magneto-optical disks, or optical disks. Machine-readable storage media suitable for embodying computer program instructions and data include various forms of non-volatile storage area, including by way of example, semiconductor storage devices, e.g., EPROM, EEPROM, flash storage devices, and solid state drives; magnetic disks, e.g., internal hard disks or removable disks; magneto-optical disks; and CD-ROM, DVD-ROM, and/or Blu-ray discs.

In some implementations, the processes described above can be implemented using software for execution on one or more mobile computing devices, one or more local computing devices, and/or one or more remote computing devices (which can be, e.g., cloud computing devices). For instance, the software forms procedures in one or more computer programs that execute on one or more programmed or programmable computer systems, either in the mobile computing devices, local computing devices, or remote computing systems (which may be of various architectures such as distributed, client/server, grid, or cloud), each including at least one processor, at least one data storage system (including volatile and non-volatile memory and/or storage elements), at least one wired or wireless input device or port, and at least one wired or wireless output device or port.

In some implementations, the software may be provided on a medium, such as CD-ROM, DVD-ROM, Blu-ray disc, a solid state drive, or a hard drive, readable by a general or special purpose programmable computer or delivered (encoded in a propagated signal) over a network to the computer where it is executed. The functions can be performed on a special purpose computer, or using special-purpose hardware, such as coprocessors. The software can be implemented in a distributed manner in which different parts of the computation specified by the software are performed by different computers. Each such computer program is preferably stored on or downloaded to a storage media or device (e.g., solid state memory or media, or magnetic or optical media) readable by a general or special purpose programmable computer, for configuring and operating the computer when the storage media or device is read by the computer system to perform the procedures described herein. The inventive system can also be considered to be implemented as a computer-readable storage medium, configured with a computer program, where the storage medium so configured causes a computer system to operate in a specific and predefined manner to perform the functions described herein.

The embodiments of the present invention that are described in this specification and the optional features and properties respectively mentioned in this regard should also be understood to be disclosed in all combinations with one another. In particular, in the present case, the description of a feature comprised by an embodiment—unless explicitly explained to the contrary—should also not be understood such that the feature is essential or indispensable for the function of the embodiment.

What is claimed is:

1. A method for operating a mask-metrology measurement apparatus, wherein an image of a section of a photomask is recorded with a first image sensor and wherein an aerial image is generated by virtue of image raw data obtained with the first image sensor being subjected to a clear normalization, and wherein the aerial image is subjected to a non-linearity adaptation which involves the following steps:

a. mathematically combining the aerial image with a clear image ($C_{T2T}$);

b. applying a linearity correction ($P_{lin1}$) to the image data generated in step a. to correct a linearity error of the first image sensor to generate linearity-corrected image data;

c. applying a non-linearity adaptation ($P^{-1}_{lin2}$) to the linearity-corrected image data obtained in step b. to imprint a linearity signature of a second image sensor not arranged in the beam path of the measurement apparatus on the image data to generate linearity-adapted image data; and d. applying a clear normalization to the linearity-adapted image data generated in step c to generate corrected photomask image data.

2. The method of claim 1, wherein the aerial image in step a. is multiplied pixel by pixel by the clear image.

3. The method of claim 1, wherein the clear image ($C_{T2T}$) is a clear image recorded with the first image sensor.

4. The method of claim 1, wherein the clear image ($C_{T2T}$) is subjected to a non-linearity adaptation to generate a linearity-adapted clear image ($C_{T2T}$), and wherein the linearity-adapted clear image ($C_{T2T}$) is used for the clear normalization in step d.

5. The method of claim 4, wherein the non-linearity adaptation of the clear image ($C_{T2T}$) comprises a linearity correction to correct a linearity error of the first image sensor.

6. The method of claim 4, wherein the non-linearity adaptation of the clear image ($C_{T2T}$) comprises a non-linearity adaptation in order to imprint a linearity signature of the second image sensor on the clear image ($C_{T2T}$).

7. The method of claim 1, wherein in a preceding method step, a measurement was carried out to ascertain the linearity error of the first image sensor.

8. The method of claim 7, wherein the measurement is carried out while an energy monitor of the measurement apparatus provides constant measurement values.

9. The method of claim 1, wherein the aerial image is an energy-normalized aerial image.

10. The method of claim 1, wherein a default correction ($P_{def}$) applicable for the second image sensor is calculated back before step a.

11. The method of claim 1, wherein the clear normalization of the aerial image is based on a first clear image (T1) and a second clear image (T2), wherein the first clear image (T1) is recorded before the image recording and the second clear image (T2) is recorded after the image recording.

12. The method of claim 11, wherein a linear interpolation is carried out over the time between the average intensity of the first clear image (T1) and the average intensity of the second clear image (T2).

13. The method of claim 1, wherein a point-imaging error of the first image sensor is corrected in the context of the non-linearity adaptation and a point-imaging error of the second image sensor is imprinted on the image data.

14. A mask-metrology measurement apparatus, comprising a first image sensor for recording an image of a section of a photomask, comprising a calculation module for generating an aerial image by virtue of image raw data obtained with the first image sensor being subjected to a clear normalization, and comprising a correction module, wherein the correction module is designed to subject the aerial image to a non-linearity adaptation, comprising the following steps:

a. mathematically combining the aerial image with a clear image ($C_{T2T}$);

b. applying a linearity correction ($P_{lin1}$) to the image data generated in step a. to correct a linearity error of the first image sensor to generate linearity-corrected image data;

c. applying a non-linearity adaptation ($P^{-1}_{lin2}$) to the linearity-corrected image data obtained in step b. to imprint a linearity signature of a second image sensor not arranged in the beam path of the measurement apparatus on the image data to generate linearity-adapted image data; and d. applying a clear normalization to the linearity-adapted image data generated in step c to generate corrected photomask image data.

15. A non-transitory computer readable comprising program parts which, when loaded into a computer or into networked computers, which are connected to an image sensor configured to record an image of a section of a photomask, are designed to carry out the method of claim 1.

16. The mask-metrology measurement apparatus of claim 14, wherein the correction module is configured to multiply the aerial image in step a. pixel by pixel by the clear image.

17. The mask-metrology measurement apparatus of claim 14, wherein the clear image ($C_{T2T}$) is a clear image recorded with the first image sensor.

18. The mask-metrology measurement apparatus of claim 14, wherein the correction module is configured to subject the clear image ($C_{T2T}$) to a non-linearity adaptation to generate a linearity-adapted clear image ($C_{T2T}$), and use the linearity-adapted clear image ($C_{T2T}$) for the clear normalization in step d.

19. The mask-metrology measurement apparatus of claim 18, wherein the non-linearity adaptation of the clear image ($C_{T2T}$) comprises a linearity correction to correct a linearity error of the first image sensor.

20. The mask-metrology measurement apparatus of claim 18, wherein the non-linearity adaptation of the clear image ($C_{T2T}$) comprises a non-linearity adaptation in order to imprint a linearity signature of the second image sensor on the clear image ($C_{T2T}$).

* * * * *